(12) United States Patent
Katsumata et al.

(10) Patent No.: US 8,378,406 B2
(45) Date of Patent: Feb. 19, 2013

(54) MULTILAYER STACKED TYPE NONVOLATILE SEMICONDUCTOR MEMORY DEVICE

(75) Inventors: Ryota Katsumata, Kanagawa-ken (JP); Yoshiaki Fukuzumi, Kanagawa-ken (JP); Masaru Kidoh, Tokyo (JP); Masaru Kito, Kanagawa-ken (JP); Hideaki Aochi, Kanagawa-ken (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 201 days.

(21) Appl. No.: 12/717,499

(22) Filed: Mar. 4, 2010

(65) Prior Publication Data

US 2011/0147818 A1    Jun. 23, 2011

(30) Foreign Application Priority Data

Dec. 17, 2009   (JP) ................. 2009-286863

(51) Int. Cl.
*H01L 29/76* (2006.01)
(52) U.S. Cl. ................. 257/314; 257/E27.081
(58) Field of Classification Search ........... 257/E27.085, 257/E27.084, 288, 317, 316, 314, E27.081
See application file for complete search history.

(56) References Cited

U.S. PATENT DOCUMENTS

| 6,727,544 | B2 | 4/2004 | Endoh et al. |
| 6,870,215 | B2 | 3/2005 | Endoh et al. |
| 7,135,726 | B2 | 11/2006 | Endoh et al. |
| 2007/0018282 | A1* | 1/2007 | Asakawa ................. 257/531 |
| 2007/0252201 | A1 | 11/2007 | Kito et al. |
| 2009/0230450 | A1* | 9/2009 | Shiino et al. ................. 257/314 |

FOREIGN PATENT DOCUMENTS

| JP | 2007-266143 | 10/2007 |
| JP | 2009-146954 | 7/2009 |
| JP | 2009-224574 A | 10/2009 |

OTHER PUBLICATIONS

Office Action issued Aug. 17, 2011 in Korean Patent Application No. 10-2010-85600 (with English translation).
U.S. Appl. No. 12/886,010, filed Sep. 20, 2010, Tanaka, et al.

* cited by examiner

*Primary Examiner* — Julio J Maldonado
*Assistant Examiner* — Robert Bachner
(74) *Attorney, Agent, or Firm* — Oblon, Spivak, McClelland, Maier & Neustadt, L.L.P.

(57) ABSTRACT

A nonvolatile semiconductor memory device includes: a substrate; a memory multilayer body with a plurality of insulating films and electrode films alternately stacked therein, the memory multilayer body being provided on a memory array region of the substrate; a semiconductor pillar buried in the memory multilayer body and extending in stacking direction of the insulating films and the electrode films; a charge storage film provided between one of the electrode films and the semiconductor pillar; a dummy multilayer body with a plurality of the insulating films and the electrode films alternately stacked therein and a dummy hole formed therein, the dummy multilayer body being provided on a peripheral circuit region of the substrate; an insulating member buried in the dummy hole; and a contact buried in the insulating member and extending in the stacking direction.

18 Claims, 17 Drawing Sheets

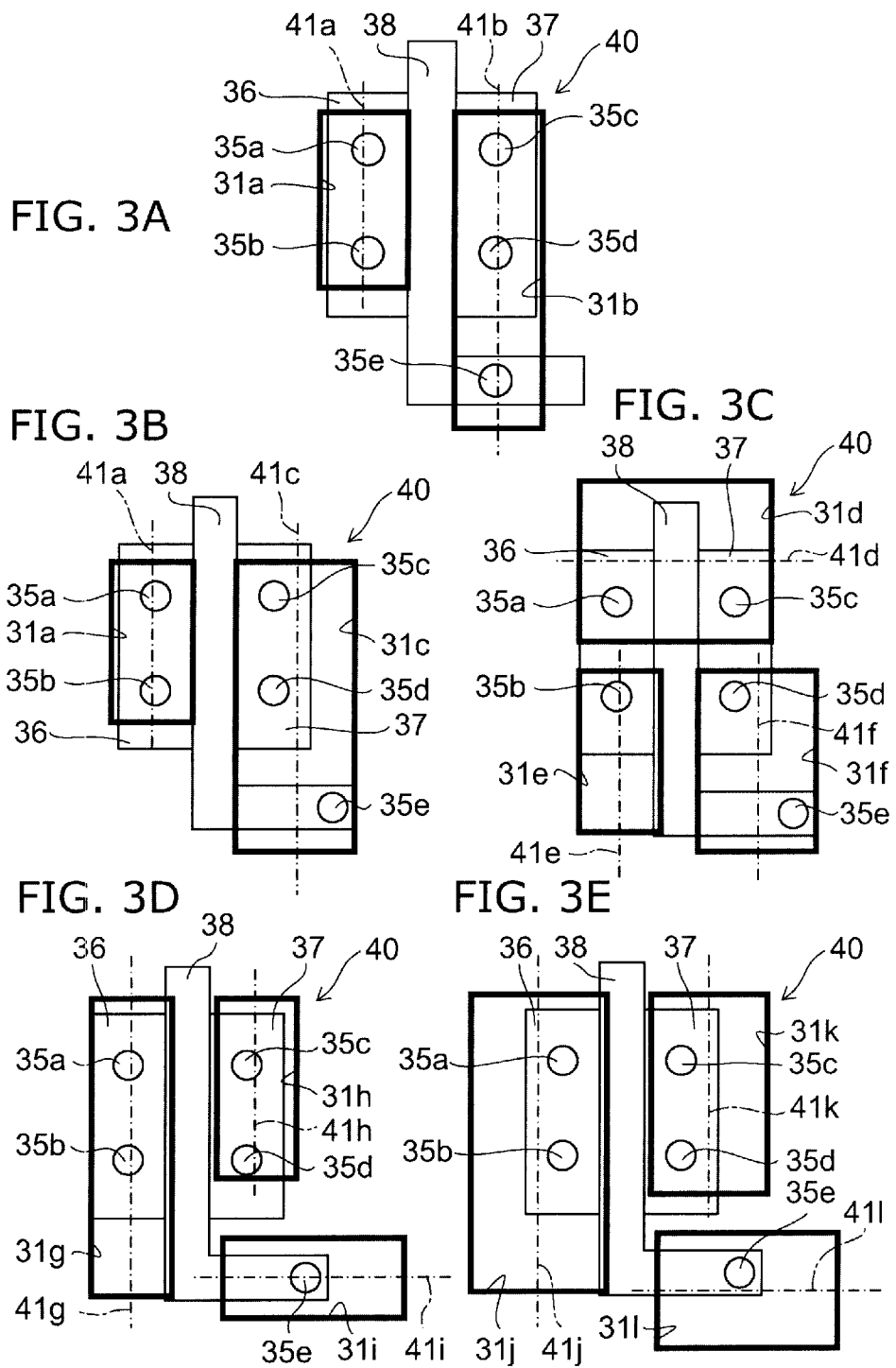

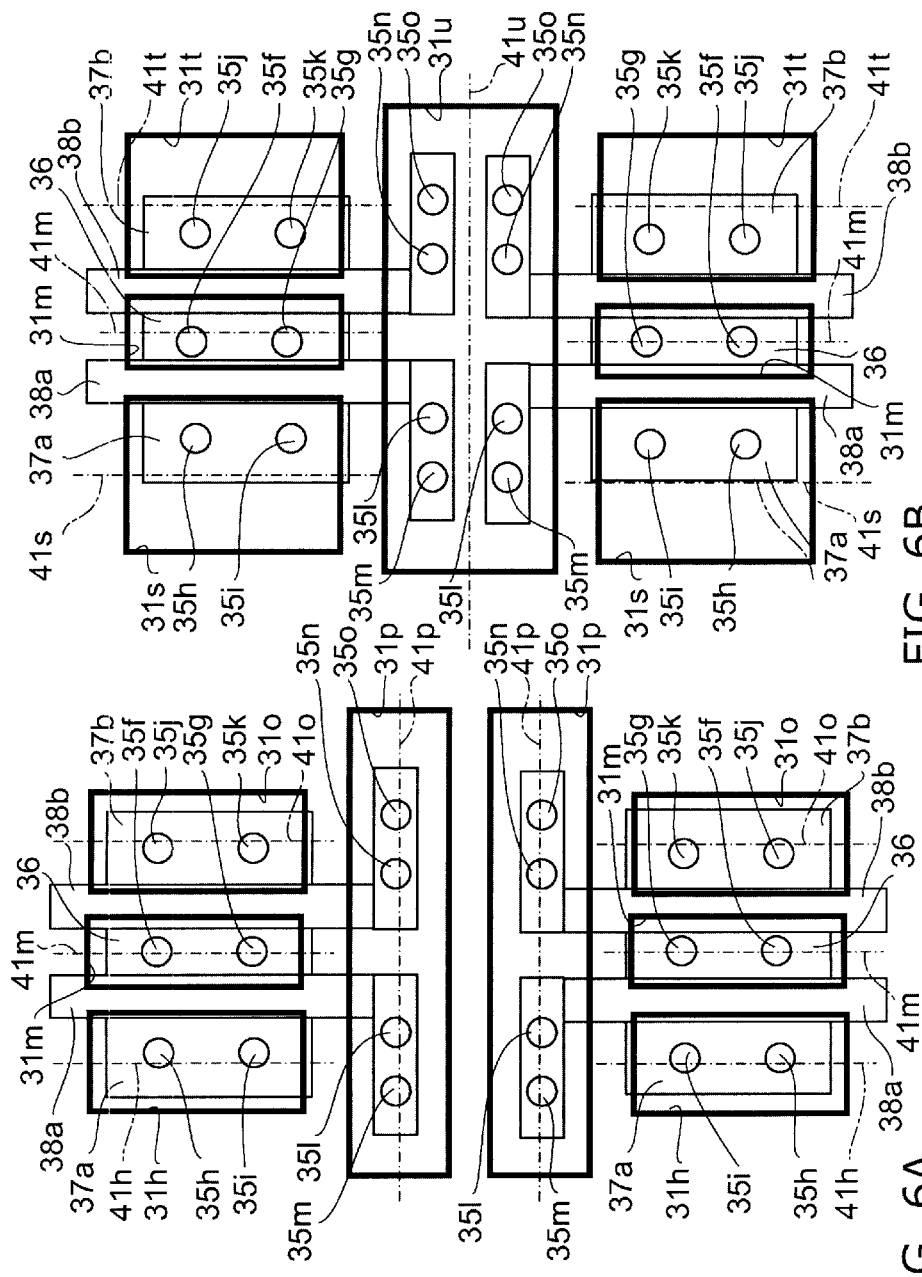

MULTILAYER STACKED TYPE NONVOLATILE SEMICONDUCTOR MEMORY DEVICE

CROSS-REFERENCE TO RELATED APPLICATIONS

This application is based upon and claims the benefit of priority from the prior Japanese Patent Application No. 2009-286863, filed on Dec. 17, 2009; the entire contents of which are incorporated herein by reference.

BACKGROUND OF THE INVENTION

1. Field of the Invention

This invention relates to a nonvolatile semiconductor memory device.

2. Background Art

As an approach to increasing capacity and reducing cost of a nonvolatile semiconductor memory device, a simultaneously processed multilayer memory is drawing attention. A simultaneously processed multilayer memory is manufactured by alternately stacking interlayer insulating films and electrode films on a semiconductor substrate to form a multilayer body, forming through holes in the multilayer body by lithography, depositing a block film, a charge film, and a tunnel film in this order in the through hole, and burying a silicon pillar in the through hole. In such a multilayer memory, a memory transistor is formed at the intersection between the electrode film and the silicon pillar and serves as a memory cell. Furthermore, the memory array region with the multilayer body formed therein is surrounded by a peripheral circuit region, in which a driver circuit for driving memory cells is formed in the upper surface of the semiconductor substrate (see, e.g., JP-A-2009-146954(Kokai)).

SUMMARY OF THE INVENTION

According to an aspect of the invention, there is provided a nonvolatile semiconductor memory device including: a substrate; a memory multilayer body with a plurality of insulating films and electrode films alternately stacked therein, the memory multilayer body being provided on a memory array region of the substrate; a semiconductor pillar buried in the memory multilayer body and extending in stacking direction of the insulating films and the electrode films; a charge storage film provided between one of the electrode films and the semiconductor pillar; a dummy multilayer body with a plurality of the insulating films and the electrode films alternately stacked therein and a dummy hole formed therein, the dummy multilayer body being provided on a peripheral circuit region of the substrate; an insulating member buried in the dummy hole; and a contact buried in the insulating member and extending in the stacking direction.

BRIEF DESCRIPTION OF THE DRAWINGS

FIGS. 3A to 3E are plan views illustrating the positional relationship between the dummy hole and the contact, where FIG. 3A shows a reference example of the first embodiment, and FIGS. 3B to 3E show examples of the first embodiment;

FIG. 5A shows a reference example of a second embodiment of the invention, and FIGS. 5B and 5C show examples of the second embodiment;

FIGS. 6A and 6B are plan views illustrating the positional relationship between the dummy hole and the contact, where FIG. 6A shows a reference example of a third embodiment of the invention, and FIG. 6B shows an example of the third embodiment;

DETAILED DESCRIPTION

Embodiments of the invention will now be described with reference to the drawings.

At the outset, a first embodiment of the invention is described.

Figure 1:
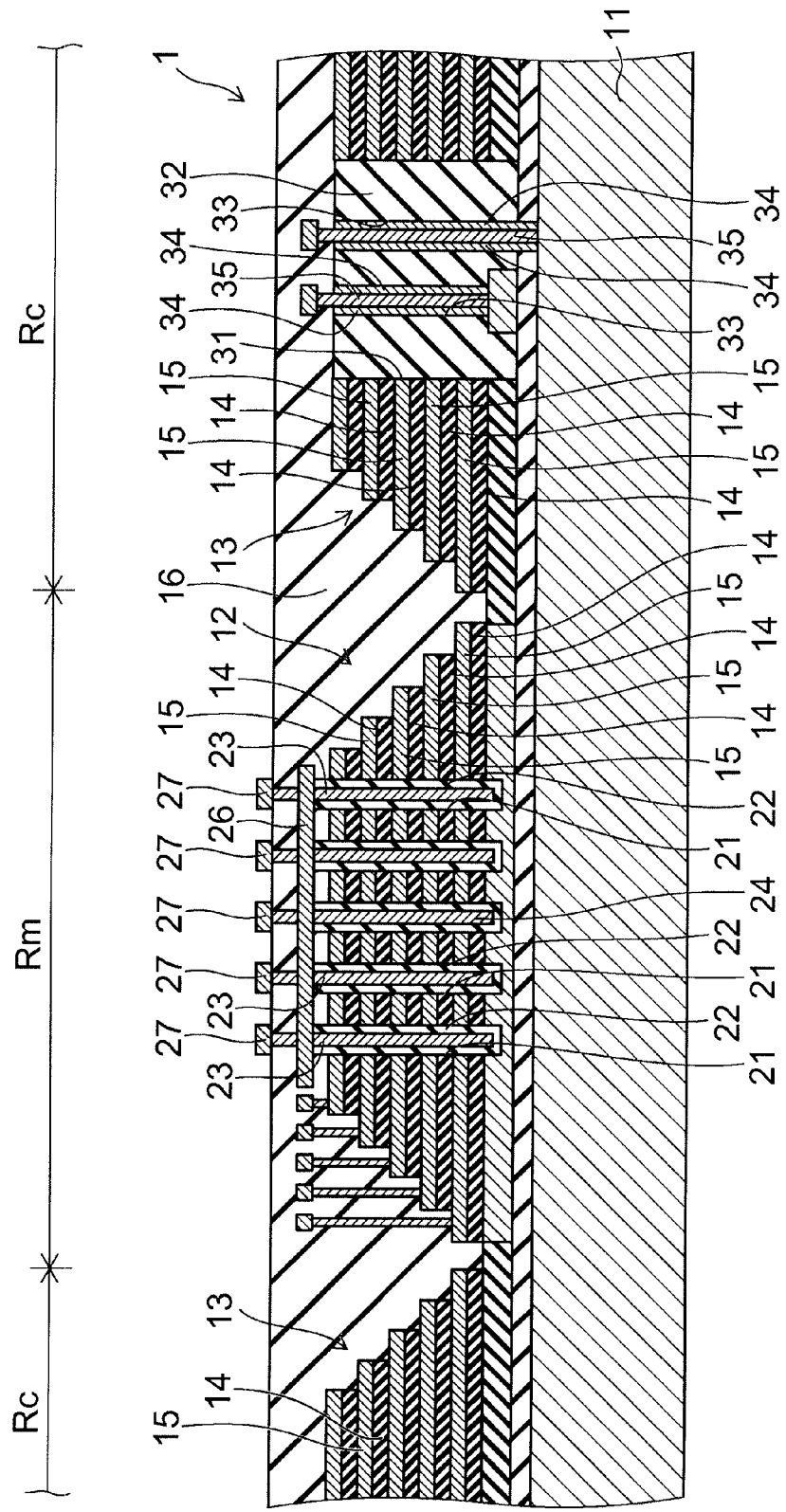
FIG. 1 is a schematic cross-sectional view illustrating a nonvolatile semiconductor memory device according to a first embodiment of the invention.

FIG. 1 is a schematic cross-sectional view illustrating a nonvolatile semiconductor memory device according to this embodiment.

Figure 2:
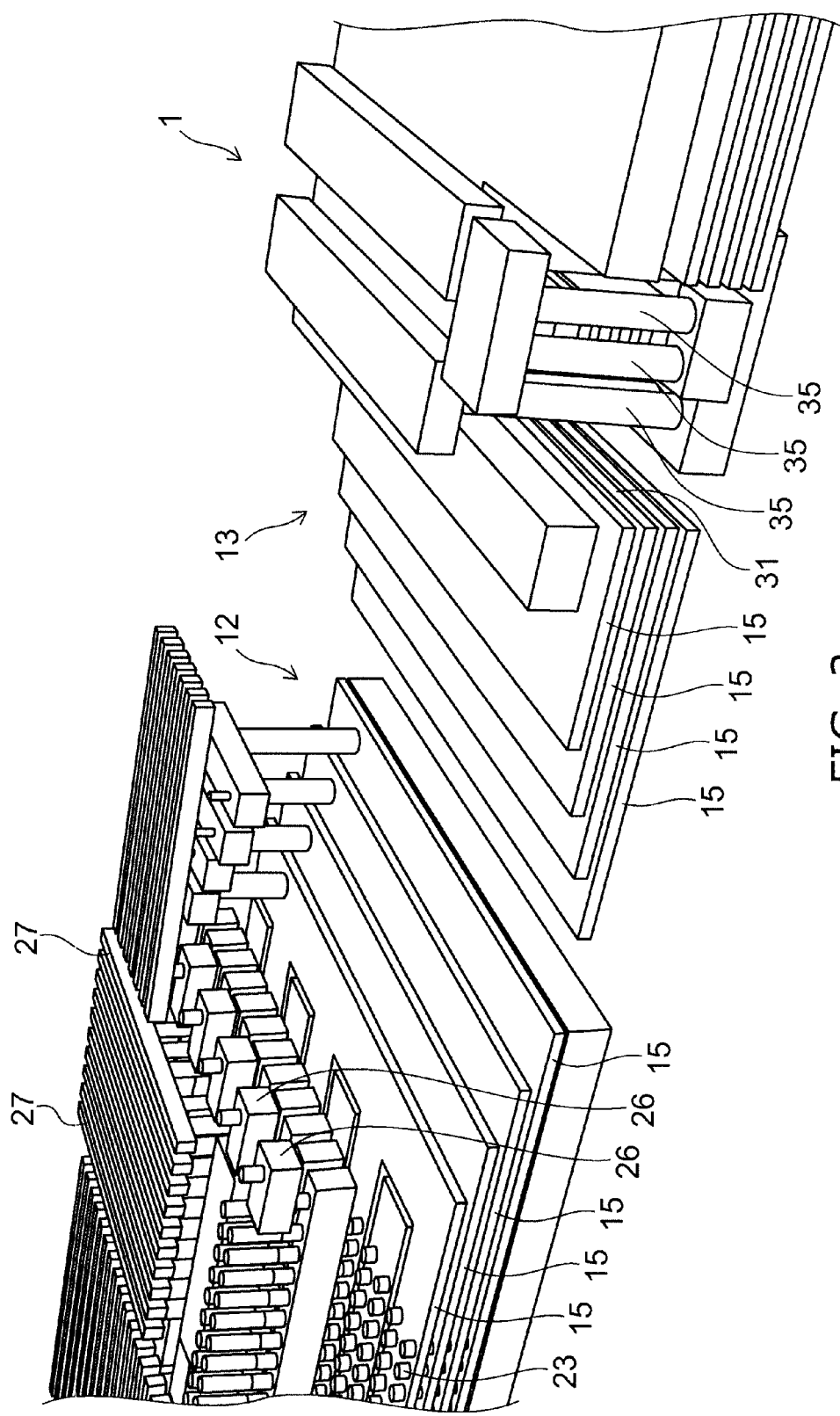
FIG. 2 is a perspective view illustrating the nonvolatile semiconductor memory device according to the first embodiment.

FIG. 2 is a perspective view illustrating the nonvolatile semiconductor memory device according to this embodiment.

As shown in FIGS. 1 and 2, the nonvolatile semiconductor memory device (hereinafter also simply referred to as "device") 1 according to this embodiment is provided with a memory array region Rm including memory cells for storing data and a peripheral circuit region Rc including a driver circuit for driving memory cells. Furthermore, the device 1 includes a silicon substrate 11 illustratively made of single crystal silicon. In the memory array region Rm, a memory multilayer body 12 is provided on the silicon substrate 11. In the peripheral circuit region Rc, a dummy multilayer body 13 is provided on the silicon substrate 11.

The memory multilayer body 12 is implemented by a plurality of insulating films 14 and a plurality of electrode films 15 alternately stacked therein. Likewise, the dummy multilayer body 13 is also implemented by a plurality of insulating films 14 and a plurality of electrode films 15 alternately stacked therein. The insulating film 14 is illustratively made of silicon oxide, and the electrode film 15 is illustratively made of polysilicon. The number of insulating films 14 and electrode films 15 stacked in the dummy multilayer body 13 is equal to the number of insulating films 14 and electrode films 15 stacked in the memory multilayer body 12, respectively. The end portion of the memory multilayer body 12 is processed into a staircase pattern with each electrode film 15 constituting a step. The end portion of the dummy multilayer body 13 is also processed likewise. Furthermore, an interlayer insulating film 16 is provided on the silicon substrate 11 so as to cover the memory multilayer body 12 and the dummy multilayer body 13.

Inside the memory multilayer body 12, memory holes 21 extending in the stacking direction of the insulating films 14 and the electrode films 15 (hereinafter simply referred to as "stacking direction") are formed. On the side surface of the memory hole 21, a block film, a charge storage film, and a tunnel film are stacked in this order to form a memory film 22. Furthermore, a silicon pillar 23 is buried in the memory hole 21. That is, the memory film 22 including a charge storage film is provided between the electrode film 15 and the silicon pillar 23. A source line 26 is provided in the interlayer insulating film 16 above the memory multilayer body 12, and a bit line 27 is provided on the interlayer insulating film 16. The silicon pillars 23 are paired two by two, and the lower ends thereof are connected to each other by a connecting member 24. Of the two silicon pillars 23 connected to each other, the upper end of one silicon pillar 23 is connected to the source line 26, and the upper end of the other silicon pillar 23 is connected to the bit line 27. Thus, in the memory multilayer body 12, a U-pillar composed of one pair of silicon pillars 23 and one connecting member 24 is connected between the source line 26 and the bit line 27. Furthermore, a memory transistor is implemented at each intersection between the silicon pillar 23 and the electrode film 15.

Inside the dummy multilayer body 13, dummy holes 31 penetrating through the dummy multilayer body 13 are formed. The width of the dummy hole 31 is larger than that of the memory hole 21, and an insulating member 32 illustratively made of silicon oxide is buried inside the dummy hole 31. A contact hole 33 extending in the stacking direction is formed in the insulating member 32. A barrier metal 34 is formed on the side surface of the contact hole 33, and a contact 35 is buried inside the contact hole 33. The barrier metal 34 is implemented illustratively by a titanium layer and a titanium nitride layer stacked in this order. The contact 35 is illustratively formed from tungsten. Furthermore, in the peripheral circuit region Rc, a driver circuit for driving the memory cell transistor is formed in the upper surface of the silicon substrate 11. The contact 35 is connected to a corresponding node of this driver circuit.

One of the features of this embodiment lies in the positional relationship between the dummy hole 31 and the contact 35. This positional relationship is described below.

FIGS. 3A to 3E are plan views illustrating the positional relationship between the dummy hole and the contact, where FIG. 3A shows a reference example of this embodiment, and FIGS. 3B to 3E show examples of this embodiment.

Figure 4A:
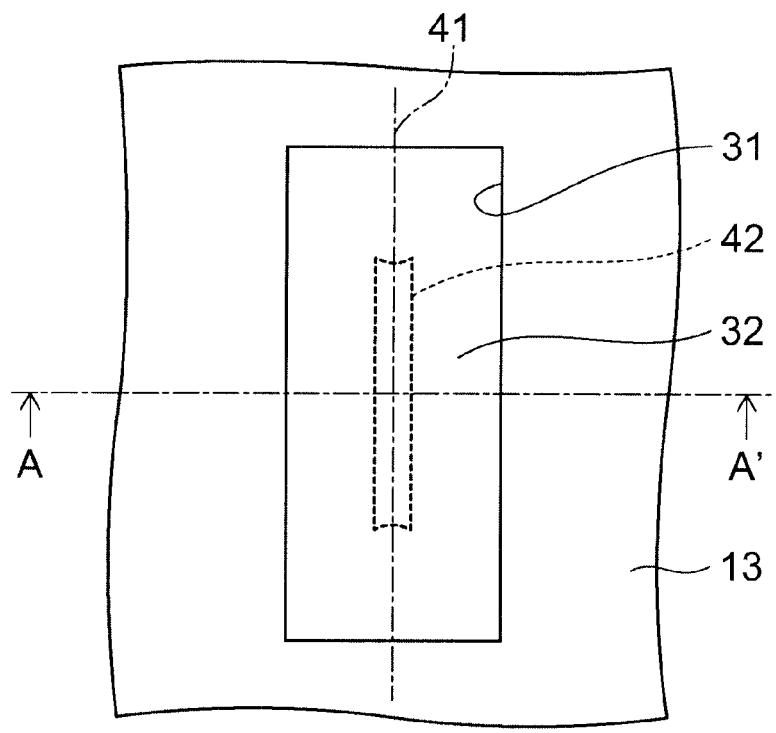
FIG. 4A is a schematic plan view showing the dummy hole.
Figure 4B:
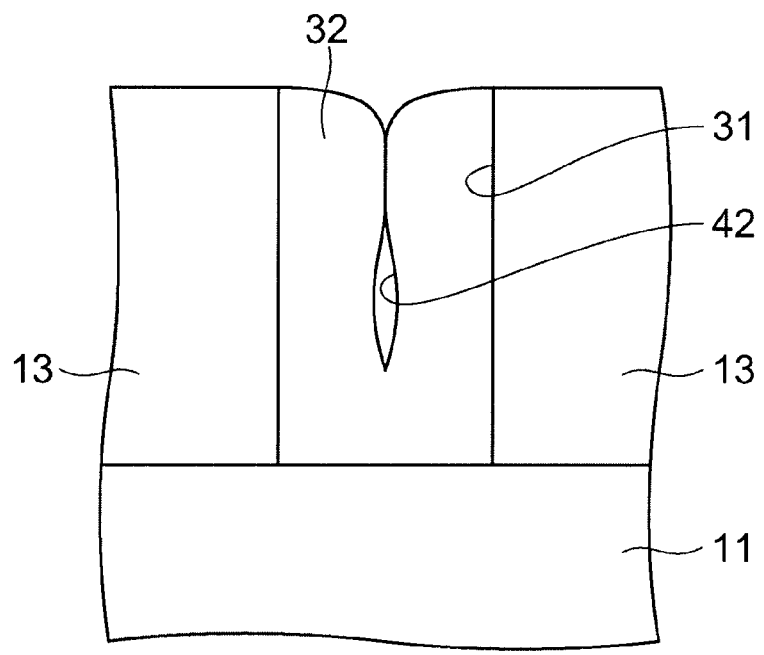
FIG. 4B is a cross-sectional view thereof taken along line A-A'.

FIG. 4A is a schematic plan view showing the dummy hole, and FIG. 4B is a cross-sectional view thereof taken along line A-A'.

For simplicity of illustration, FIG. 3 only shows the outer edge of the dummy hole 31, the contact 35, and the conductive members connected to the contact 35. This also applies to FIGS. 5 and 6 described later.

As shown in FIG. 3A, in the peripheral circuit region Rc, a source layer 36 and a drain layer 37 are formed in an upper portion of the silicon substrate 11 and spaced from each other. The region of the silicon substrate 11 between the source layer 36 and the drain layer 37 constitutes a channel region (not shown), a gate insulating film (not shown) is formed immediately above the channel region, and a gate electrode 38 is provided thereon. Thus, a MOSFET (metal-oxide-semiconductor field-effect transistor) 40 is formed in the upper surface of the silicon substrate 11. The gate electrode 38 is extracted outside the channel region and illustratively bent at a right angle. The MOSFET 40 is an active element constituting the aforementioned driver circuit.

Two contacts 35a and 35b are connected to the source layer 36, two contacts 35c and 35d are connected also to the drain layer 37, and one contact 35e is connected to the gate electrode 38. The contact 35e is connected to the portion of the gate electrode 38 displaced from immediately above the channel region, and the contacts 35c, 35d, and 35e are arranged linearly. The contacts 35a and 35b are subjected to an equal potential, and the contacts 35c and 35d are subjected to an equal potential. However, the potential applied to the contacts 35a and 35b, the potential applied to the contacts 35c and 35d, and the potential applied to the contact 35e are normally different from one another. In this embodiment, the contacts 35a-35e are collectively referred to as contact 35, dummy holes 31a-31l are collectively referred to as dummy hole 31, and center lines 41a-41l are collectively referred to as center line 41. This also applies to other embodiments described later.

As shown in FIG. 3A, in the reference example of this embodiment, the contacts 35a and 35b connected to the source line 36 are placed in one dummy hole 31a. As viewed in the stacking direction, the dummy hole 31a is shaped like a rectangle, and the centers of the contacts 35a and 35b are located on a center line 41a extending longitudinally along the dummy hole 31a. Furthermore, the contacts 35c and 35d connected to the drain layer 37 and the contact 35e connected to the gate electrode 38 are placed in another dummy hole 31b. As viewed in the stacking direction, the dummy hole 31b is shaped like a rectangle, and the centers of the contacts 35c, 35d, and 35e are located on a center line 41b extending longitudinally along the dummy hole 31b.

In order to ensure insulation between the contact 35 and the electrode film 15 and reduce parasitic capacitance, the dummy hole 31 needs to be formed larger to some extent than the contact 35. Thus, the existence of the dummy hole 31 interferes with downsizing of the MOSFET 40. However, as in this reference example, if a plurality of contacts 35 are placed in one dummy hole 31, the number of dummy holes 31 can be made smaller than in the case of forming one dummy hole 31 for each contact 35, and the MOSFET 40 can be downsized.

However, according to the inventors' study, it has been found that in the positional relationship between the dummy hole 31 and the contact 35 as in this reference example, the contact 35d and the contact 35e may be short-circuited. This is presumably because a seam is formed when the insulating member 32 is buried in the dummy hole 31, and the barrier metal 34 is buried inside this seam, forming a current path.

More specifically, as shown in FIGS. 4A and 4B, in the step for depositing an insulating material in the dummy hole 31 to bury an insulating member 32 therein, the insulating material tends to be adhered to the upper portion of the side surface of the dummy hole 31. Hence, a seam 42 may be formed in the lower portion of the insulating member 32. As viewed in the stacking direction, the seam 42 is formed in a region including the center line 41 of the dummy hole 31. Here, if a contact hole 33 is formed in the insulating member 32 in a region including the center line 41, this contact hole 33 communicates with the seam 42. Thus, when a barrier metal 34 is formed on the inner surface of the contact hole 33, part of this barrier metal 34 penetrates into the seam 42 through the contact hole 33, and a current path may be formed between the contact holes 33.

Thus, this embodiment takes the following countermeasures (1) and (2).

(1) A plurality of contacts 35 placed in the same dummy hole 31 are used as contacts always subjected to an equal potential. Thus, no problem occurs with any short circuit between the contacts 35 placed in the same dummy hole 31.

(2) A plurality of contacts 35 placed in the same dummy hole 31 are displaced, as viewed in the stacking direction, from the center line 41 extending longitudinally along the dummy hole 31. Thus, the contact 35 can be provided at a position spaced from the seam 42, which can prevent the barrier metal 34 from penetrating into the seam 42.

Here, it is only necessary to implement at least one of the above countermeasures (1) and (2). However, it is also possible to implement both.

As shown in FIG. 3B, in a first example of this embodiment, a dummy hole 31c to enclose the contacts 35c, 35d, and 35e is formed. Here, the contacts 35c, 35d, and 35e are formed at positions displaced from the center line 41. Thus, even if a seam is formed in the dummy hole 31c, the barrier metal 34 does not penetrate into the seam, and no short circuit occurs among the contacts 35c, 35d, and 35e through the barrier metal 34. On the other hand, the contacts 35a and 35b are placed in the dummy hole 31a and located on the center line 41a of the dummy hole 31a. However, the contacts 35a and 35b are both connected to the source layer 36 of the MOSFET 40, and always subjected to an equal potential. Hence, no problem occurs with any short circuit therebetween.

As shown in FIG. 3C, in a second example of this embodiment, the contacts 35a and 35c are placed in a dummy hole 31d. The contacts 35a and 35c are placed in a region displaced from the center line 41d of the dummy hole 31d. Thus, no short circuit occurs between the contact 35a and the contact 35c. Furthermore, the contact 35b is placed in a dummy hole 31e. The contact 35b is placed on the center line 41e of the dummy hole 31e, but only the contact 35b is placed in the dummy hole 31e. Hence, no short circuit occurs between the contact 35b and other contacts 35. Furthermore, the contacts 35d and 35e are placed in a dummy hole 31f. The contacts 35d and 35e are displaced from the center line 41f of the dummy hole 31f. Thus, no short circuit occurs between the contact 35d and the contact 35e. Moreover, no short circuit occurs between the contacts 35 placed in different dummy holes 31. Hence, in this example, no short circuit occurs between the contacts 35.

As shown in FIG. 3D, in a third example of this embodiment, the contacts 35a and 35b are placed in a dummy hole 31g, the contacts 35c and 35d are placed in a dummy hole 31h, and the contact 35e is placed in a dummy hole 31i. In each dummy hole 31, each contact 35 is placed on the center line 41 of the dummy hole 31. However, the contacts 35a and 35b are both connected to the source layer 36 of the MOSFET 40, the contacts 35c and 35d are both connected to the drain layer 37 of the MOSFET 40, and the contact 35e is connected to the gate electrode 38 of the MOSFET 40. Thus, in this example, each dummy hole 31 includes only the contacts 35 subjected to an equal potential, and hence there is no problem with any short circuit occurring in the dummy hole 31. Furthermore, no short circuit occurs between the contacts 35 placed in different dummy holes 31.

As shown in FIG. 3E, also in a fourth example of this embodiment, as in the third example, each dummy hole 31 includes only the contacts 35 subjected to an equal potential. More specifically, the contacts 35a and 35b connected to the source layer 36 are placed in a dummy hole 31j, the contacts 35c and 35d connected to the drain layer 37 are placed in a dummy hole 31k, and the contact 35e connected to the gate electrode 38 is placed in a dummy hole 31l. In each dummy hole 31, each contact is placed in a region displaced from the center line 41 of the dummy hole 31. Like the third example, this example can also prevent short circuit between the contacts 35 subjected to different potentials.

Next, the effect of this embodiment is described.

According to this embodiment, a memory multilayer body 12 is provided on the silicon substrate 11 in the memory array region Rm, and a dummy multilayer body 13 is provided on the silicon substrate 11 in the peripheral circuit region Rc. The number of insulating films 14 and electrode films 15 stacked in the dummy multilayer body 13 is equal to the number of insulating films 14 and electrode films 15 stacked in the memory multilayer body 12, respectively. Hence, the upper surface of the memory multilayer body 12 is generally coplanar with the upper surface of the dummy multilayer body 13. Thus, after the memory multilayer body 12 and the dummy multilayer body 13 are formed on the silicon substrate 11, when the upper surface of an interlayer insulating film 16 deposited so as to bury them is planarized by CMP (chemical mechanical polishing), a step difference is less likely to occur at the upper surface of the interlayer insulating film 16. Hence, the nonvolatile semiconductor memory device 1 according to this embodiment is easy to manufacture.

In contrast, if no dummy multilayer body 13 is provided in the peripheral circuit region Rc, a step difference corresponding to the thickness of the memory multilayer body 12 is formed between the memory array region Rm and the peripheral circuit region Rc. This step difference has a height of well over 1 micron, causing a significant difference in the depth of focus in lithography between the memory array region Rm and the peripheral circuit region Rc. Hence, if the depth of focus is adjusted to the upper surface of the memory multilayer body 12 to form memory holes 21, it is difficult to form contact holes and the like in the peripheral circuit region Rc. Thus, it is necessary to deposit an interlayer insulating film entirely on the silicon substrate 11 so as to bury the memory multilayer body 12, and to planarize the upper surface of this interlayer insulating film by CMP. However, a large step difference between the memory array region Rm and the peripheral circuit region Rc makes the planarization extremely difficult.

Thus, according to this embodiment, the dummy multilayer body 13 is provided in the peripheral circuit region Rc to prevent formation of step difference so that the upper surface of the interlayer insulating film 16 can be planarized to facilitate lithography. Thus, the device according to this embodiment has high shape stability and reliability. To achieve this effect, when the upper surface of the silicon substrate 11 is partitioned into a plurality of unit regions, it is preferable that the memory multilayer body 12 and the dummy multilayer body 13 be provided in any unit region at an area ratio of 50% or more in total. Furthermore, if the above requirement is applied to the unit region shaped like a square measuring 10 microns on a side, the aforementioned effect can be reliably achieved.

In the device 1 according to this embodiment, a plurality of contacts 35 are placed in at least one dummy hole 31. Thus, as compared with the case where only one contact 35 is placed in one dummy hole 31, the MOSFET 40 can be downsized. Consequently, the packing density of the peripheral circuit region Rc can be increased, and the overall device 1 can be downsized. Furthermore, by forming a dummy hole 31 sufficiently larger than the contact 35, the distance between the contact 35 and the electrode film 15 included in the dummy multilayer body 13 is increased. This can ensure insulation and reduce parasitic capacitance.

Furthermore, in this embodiment, as described above, in the case where a plurality of contacts 35 are placed in one dummy hole 31, (1) a plurality of contacts 35 placed in the same dummy hole 31 are used as contacts always subjected to an equal potential, or (2) a plurality of contacts 35 placed in the same dummy hole 31 are displaced, as viewed in the stacking direction, from the center line 41 of the dummy hole 31. This can prevent short circuit between the contacts 35 subjected to different potentials. Consequently, according to this embodiment, a nonvolatile semiconductor memory device with high reliability can be realized.

Next, a second embodiment of the invention is described.

Figure 5A:
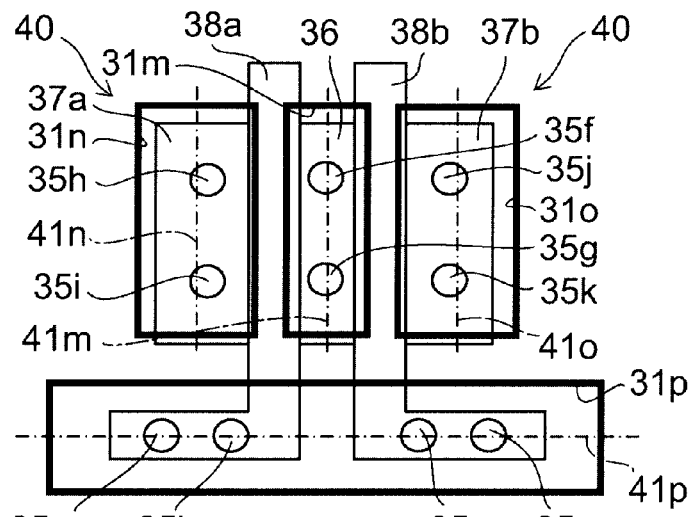
FIGS. 5A to 5C are plan views illustrating the positional relationship between the dummy hole and the contact, where
Figure 5B:
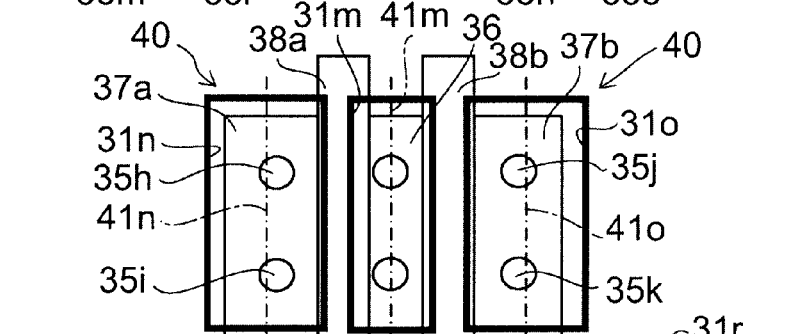
Figure 5C:
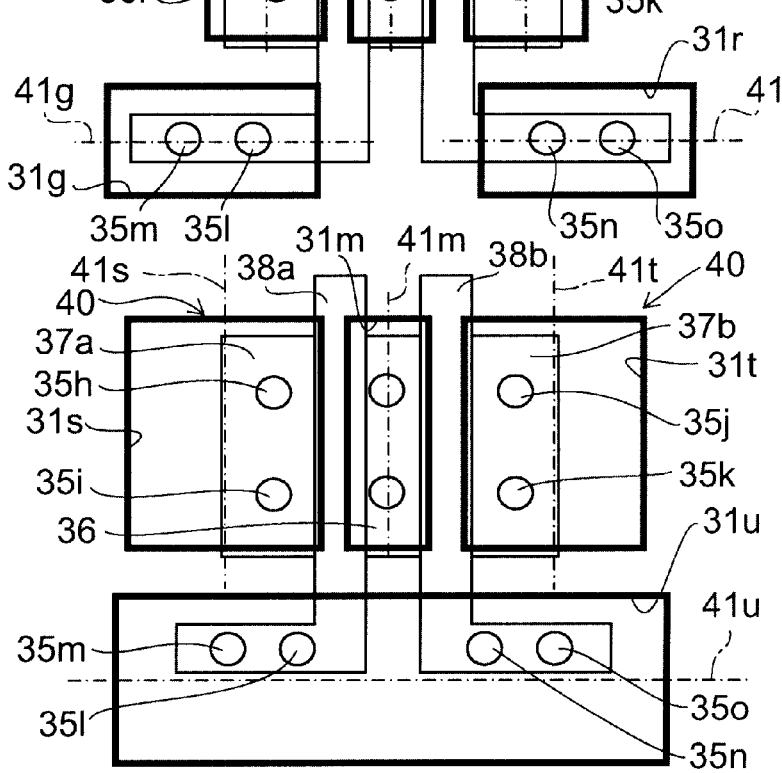

FIGS. 5A to 5C are plan views illustrating the positional relationship between the dummy hole and the contact, where FIG. 5A shows a reference example of this embodiment, and FIGS. 5B and 5C show examples of this embodiment.

As shown in FIGS. 5A to 5C, in this embodiment, a pair of MOSFETs 40 are formed with the source layer or the drain layer shared therebetween. For instance, in the example shown in FIG. 5A, the source layer 36 is shared between a pair of MOSFETs 40, and two drain layers 37a and 37b are spaced from each other. Furthermore, a gate electrode 38a is provided immediately above the channel region (not shown) between the source layer 36 and the drain layer 37a, and a gate electrode 38b is provided immediately above the channel region (not shown) between the source layer 36 and the drain layer 37b. The gate electrode 38a and the gate electrode 38b are subjected to potentials independently of each other.

Furthermore, as shown in FIG. 5A, in the reference example of this embodiment, the contacts 35f and 35g connected to the source layer 36 are placed in a dummy hole 31m, the contacts 35h and 35i connected to the drain layer 37a are placed in a dummy hole 31n, and the contacts 35j and 35k connected to the drain layer 37b are placed in a dummy hole 31o. Furthermore, the contacts 35n and 35m connected to the gate electrode 38a and the contacts 35n and 35o connected to the gate electrode 38b are placed in one dummy hole 31p. Each contact 35 is placed on the center line 41 of the dummy hole 31.

In this reference example, in the dummy hole 31p, the contacts 35m, 35l, 35n, and 35o are arranged linearly in this order in a region including the center line 41p. The contacts 35m and 35l are normally subjected to a different potential than the contacts 35n and 35o. Thus, short circuit may occur between the contact 35l and the contact 35n through the barrier metal 34 (see FIG. 1) formed inside a seam.

In contrast, as shown in FIG. 5B, in a first example of this embodiment, the dummy hole 31p in the reference example is separated into two dummy holes 31q and 31r. The contacts 35l and 35m connected to the gate electrode 38a are placed in the dummy hole 31q, and the contacts 35n and 35o connected to the gate electrode 38b are placed in the dummy hole 31r.

Thus, because the contact 35l and the contact 35n are placed in different dummy holes 31, no short circuit occurs therebetween.

As shown in FIG. 5C, in a second example of this embodiment, dummy holes 31s, 31t, 31u are formed instead of the dummy holes 31n, 31o, 31p in the reference example, respectively. The dummy holes 31s, 31t, 31u are larger than the dummy holes 31n, 31o, 31p, respectively, and each contact 35 is placed in a region displaced from the center line 41n, 41o, 41p of the dummy hole 31n, 31o, 31p. In this example, each contact 35 is formed in a region displaced from the center line 41 of the dummy hole 31, and hence is spaced from the seam of the dummy hole 31, resulting in no short circuit.

Thus, this embodiment can also prevent short circuit between the contacts 35 subjected to different potentials. The configuration and effect of this embodiment other than the foregoing are the same as those of the above first embodiment.

Next, a third embodiment of the invention is described.

FIGS. 6A and 6B are plan views illustrating the positional relationship between the dummy hole and the contact, where FIG. 6A shows a reference example of this embodiment, and FIG. 6B shows an example of this embodiment.

As shown in FIG. 6A, the reference example of this embodiment includes two pairs of the MOSFETs 40 described in the reference example of the above second embodiment (see FIG. 5A). Thus, also in this reference example, as in the reference example of the second embodiment, short circuit may occur between the contact 35l connected to the gate electrode 38a and the contact 35n connected to the gate electrode 38b.

In contrast, as shown in FIG. 6B, in the example of this embodiment, dummy holes are placed as in the second example of the above second embodiment. Here, the contacts 35 connected to the four gate electrodes 38 are placed on both sides of the center line 41u in one dummy hole 31u. That is, one dummy hole 31u is shared among the two pairs of MOSFETs 40. This reduces the number of dummy holes 31 to achieve device downsizing, and the formation position of the contacts 35 can be displaced from the center line 41 to prevent short circuit between the contacts 35. The configuration and effect of this embodiment other than the foregoing are the same as those of the above second embodiment.

Next, a fourth embodiment of the invention is described.

Figure 7:
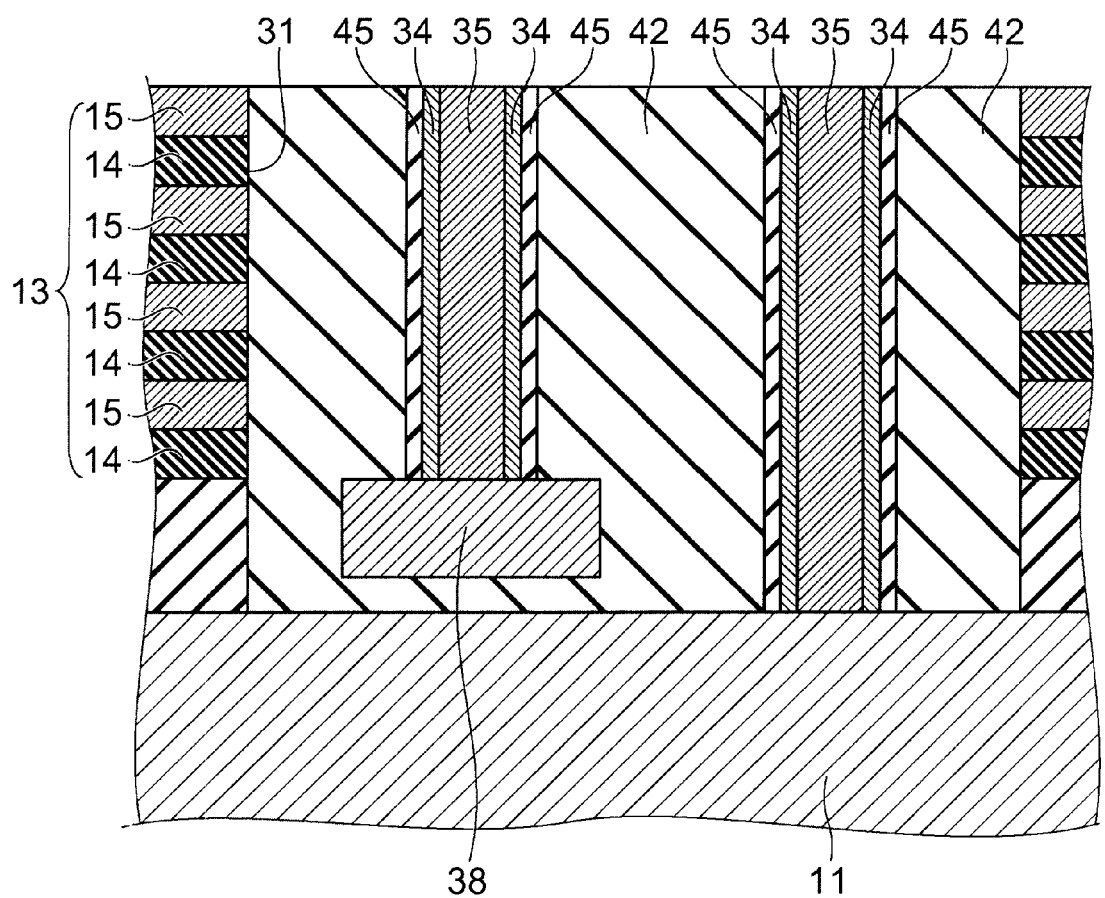
FIG. 7 is a cross-sectional view illustrating a nonvolatile semiconductor memory device according to a fourth embodiment of the invention.

FIG. 7 is a cross-sectional view illustrating a nonvolatile semiconductor memory device according to this embodiment.

This embodiment uses the following method (3) in addition to the two methods for avoiding short circuit described in the above first embodiment, that is, (1) the method of always applying an equal potential to a plurality of contacts 35 placed in the same dummy hole 31, and (2) the method of displacing a plurality of contacts 35 placed in the same dummy hole 31 from the center line 41 of the dummy hole 31.

(3) A spacer insulating film 45 is formed on the side surface of the contact hole 33. This prevents the barrier metal 34 from penetrating into the seam.

More specifically, as shown in FIG. 7, in the nonvolatile semiconductor memory device according to this embodiment, the spacer insulating film 45 is formed on the side surface of the contact hole 33. The spacer insulating film 45 is illustratively formed from silicon nitride. Thus, even if a seam is formed in the insulating member 32, the spacer insulating film 45 occludes the seam to prevent the barrier metal 34 from penetrating into the seam so that the contacts 35 can be insulated from each other. The device of such a configuration can be fabricated by burying an insulating member 32 in the dummy hole 31, forming a contact hole 33 in the insulating member 32, then forming a spacer insulating film 45 on the side surface of the contact hole 33, and subsequently forming a barrier metal 34 and a contact 35. As in the above first to third embodiment, this embodiment can also prevent short circuit between the contacts 35 placed in the same dummy hole 31. The configuration and effect of this embodiment other than the foregoing are the same as those of the above first embodiment.

This embodiment may be practiced in combination with the above first to third embodiment. More specifically, as in the above first to third embodiment, in the case where a plurality of contacts 35 are placed in one dummy hole 31, only the contacts 35 subjected to an equal potential is placed therein, or the contacts 35 are placed in a region displaced from the center line 41 of the dummy hole 31, and in addition, the spacer insulating film 45 may be formed on the side surface of the contact hole 33.

Next, a fifth embodiment of the invention is described.

This embodiment relates to a method for manufacturing a device similar to the nonvolatile semiconductor memory device according to the above first to fourth embodiment.

FIGS. 8 to 17 are process cross-sectional views illustrating the method for manufacturing a nonvolatile semiconductor memory device according to this embodiment.

Figure 8:
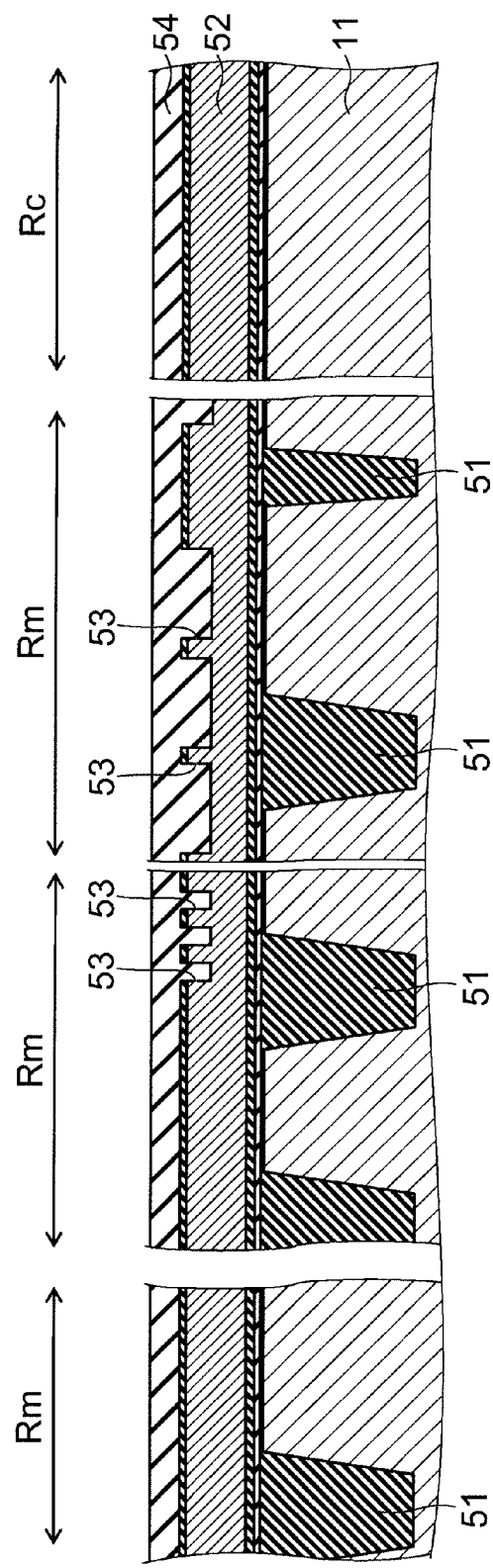
FIGS. 8 to 17 are process cross-sectional views illustrating a method for manufacturing a nonvolatile semiconductor memory device according to a fifth embodiment of the invention.

First, as shown in FIG. 8, an STI (shallow trench isolation) 51 is formed in an upper portion of a silicon substrate 11. Next, in the peripheral circuit region Rc, a thick gate insulating film for a high breakdown voltage transistor (not shown) and a thin gate insulating film for a low breakdown voltage transistor (not shown) are formed. Next, an amorphous silicon film 52 is deposited entirely on the silicon substrate 11. Next, in a central portion of the memory array region Rm, strip-shaped trenches 53 are formed in the upper surface of the amorphous silicon film 52. Next, a silicon nitride film 54, for instance, is deposited as a sacrificial film on the amorphous silicon film 52.

Figure 9:
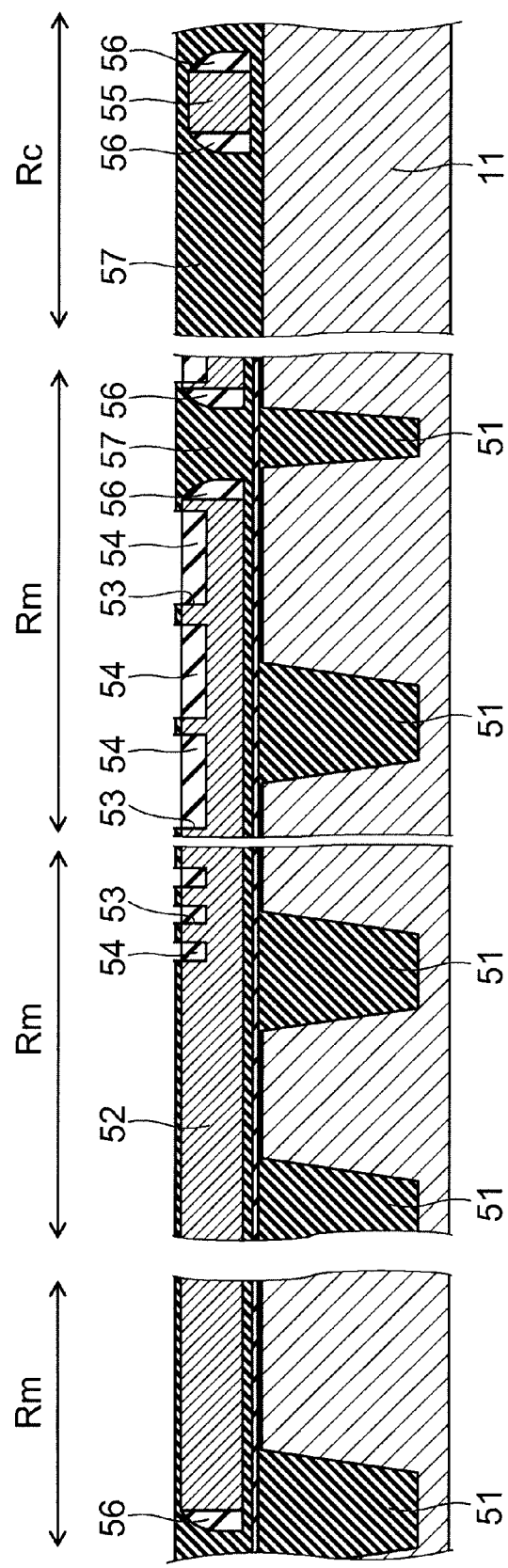

Next, as shown in FIG. 9, in the peripheral circuit region Rc, the amorphous silicon film 52 is selectively removed to form a gate electrode 55. Next, a sidewall 56 is formed on the side surface of the gate electrode 55. Next, the gate electrode 55 and the sidewall 56 are used as a mask to implant impurity ions into the silicon substrate 11. Thus, diffusion layers such as a source layer (not shown) and a drain layer (not shown) are formed in an upper portion of the silicon substrate 11. Next, an interlayer insulating film 57 is deposited, and the upper surface is planarized. Next, the interlayer insulating film 57 is recessed to align the upper surface of the interlayer insulating film 57 with the height of the upper surface of the amorphous silicon film 52. Next, the silicon nitride film 54 is recessed and removed from above the upper surface of the amorphous silicon film 52. Thus, the silicon nitride film 54 as a sacrificial film is left only in the trench 53. In the following, the sidewall 56 is regarded as being integrated with the interlayer insulating film 57, and not shown.

Figure 10:
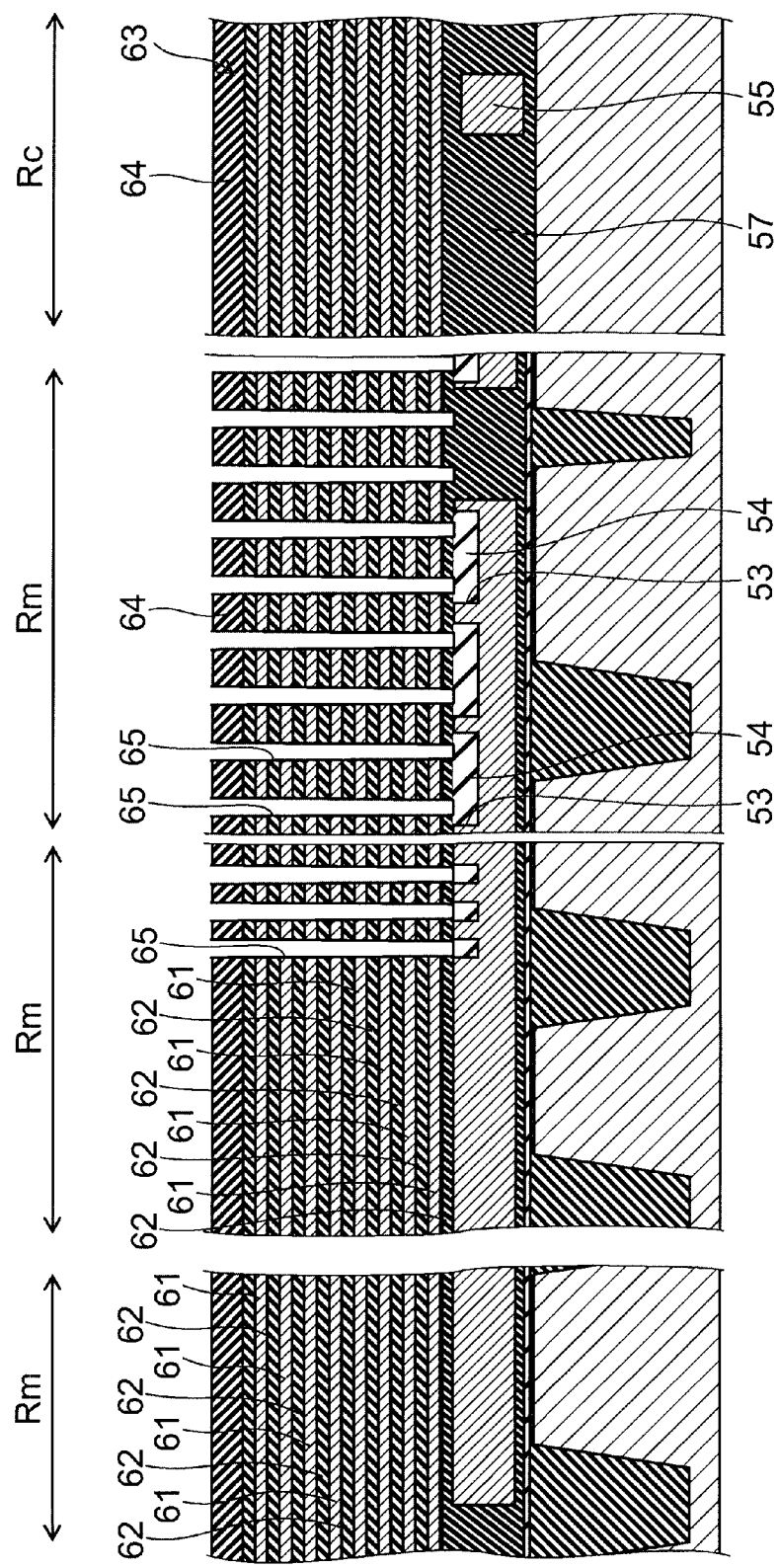

Next, as shown in FIG. 10, amorphous silicon films 61 to serve as electrode films and silicon oxide films 62 to serve as insulating films are alternately deposited to form a multilayer body 63 entirely on the silicon substrate 11. Next, a silicon oxide film 64 illustratively made of BSG (boron-doped glass) is formed as a mask material on the multilayer body 63. Next, the silicon oxide film 64 is patterned by lithography to form openings in regions where memory holes are to be formed. Next, the silicon oxide film 64 is used as a mask to perform etching to simultaneously form memory holes 65 in the multilayer body 63. The memory holes 65 are formed so as to reach both end portions of the silicon nitride film 54 buried in the trench 53.

Figure 11:
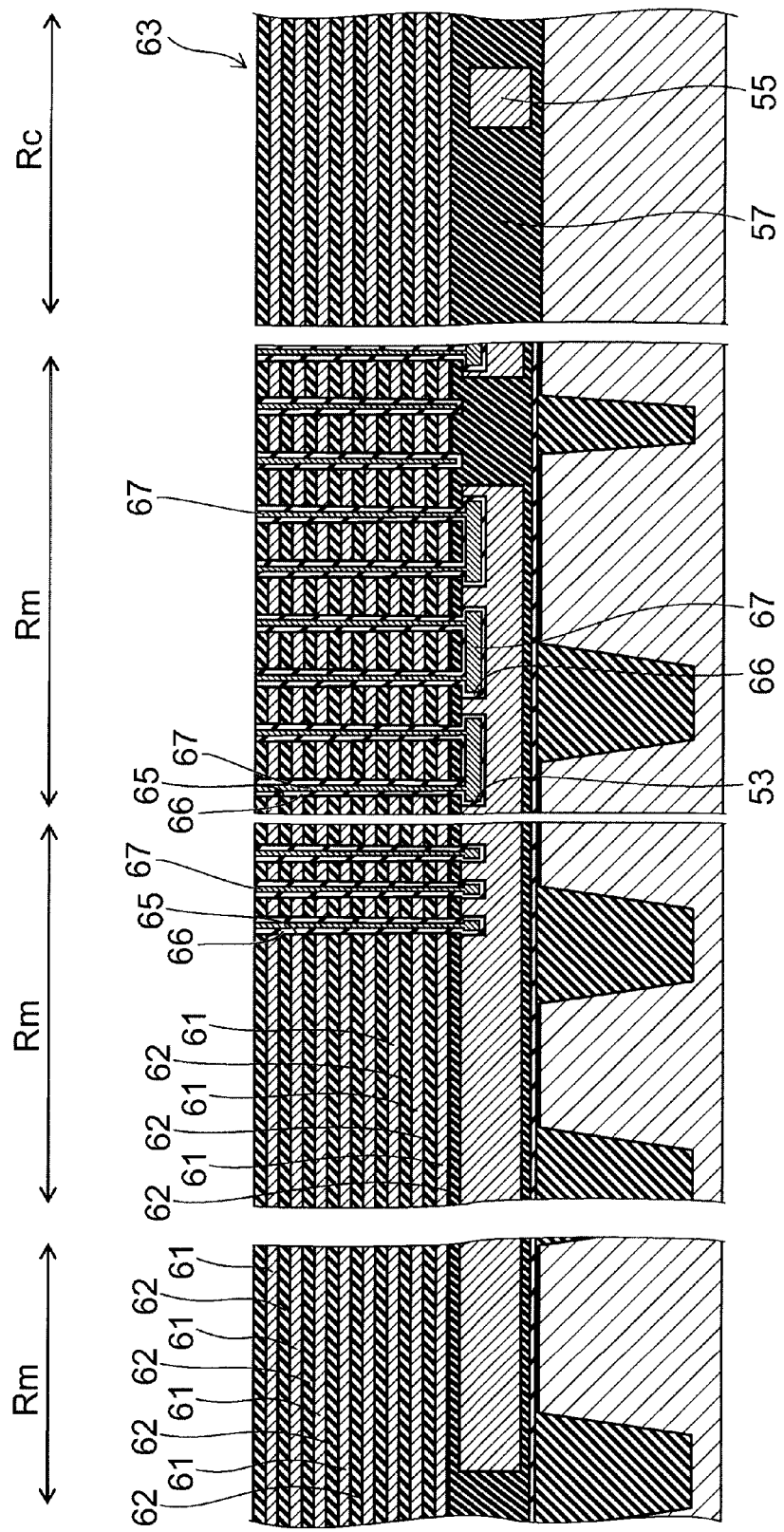

Next, as shown in FIG. 11, wet etching is performed through the memory holes 65 to remove the silicon nitride film 54 (see FIG. 10) from inside the trench 53. Next, a silicon oxide film to serve as a block film, a silicon nitride film to serve as a charge storage film, and a silicon oxide film to serve as a tunnel film are stacked in this order on the inner surface of the memory hole 65 and the trench 53 to form a memory film 66. Next, amorphous silicon is deposited. Next, the amorphous silicon and the memory film 66 are removed from above the multilayer body 63, and left only inside the memory hole 65 and the trench 53. Thus, a U-pillar 67 shaped like a letter U is formed inside the memory hole 65 and the trench 53. In the U-pillar 67, the portion located in the memory hole 65 constitutes a silicon pillar, and the portion located in the trench 53 constitutes a connecting member.

Figure 12:
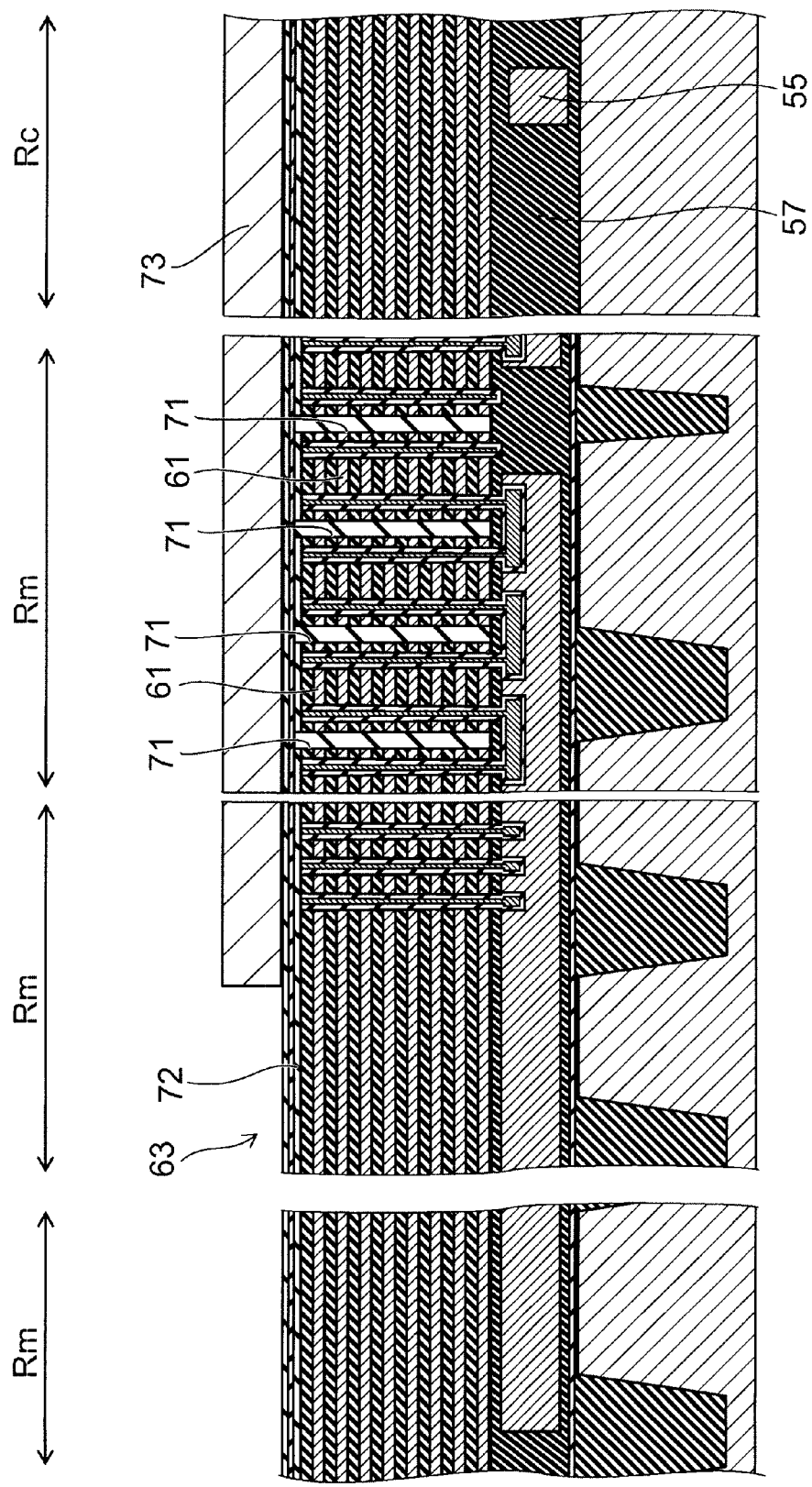

Next, as shown in FIG. 12, trenches 71 are formed in the multilayer body 63 to process the amorphous silicon films 61 into a line shape. Next, an interlayer insulating film 72 is deposited, and the upper surface is planarized. Next, amorphous silicon is deposited to form a silicon film 73. The silicon film 73 is a film to serve as a select gate electrode in a later step. Next, the silicon film 73 is removed from the outer peripheral portion of the memory array region Rm.

Figure 13:
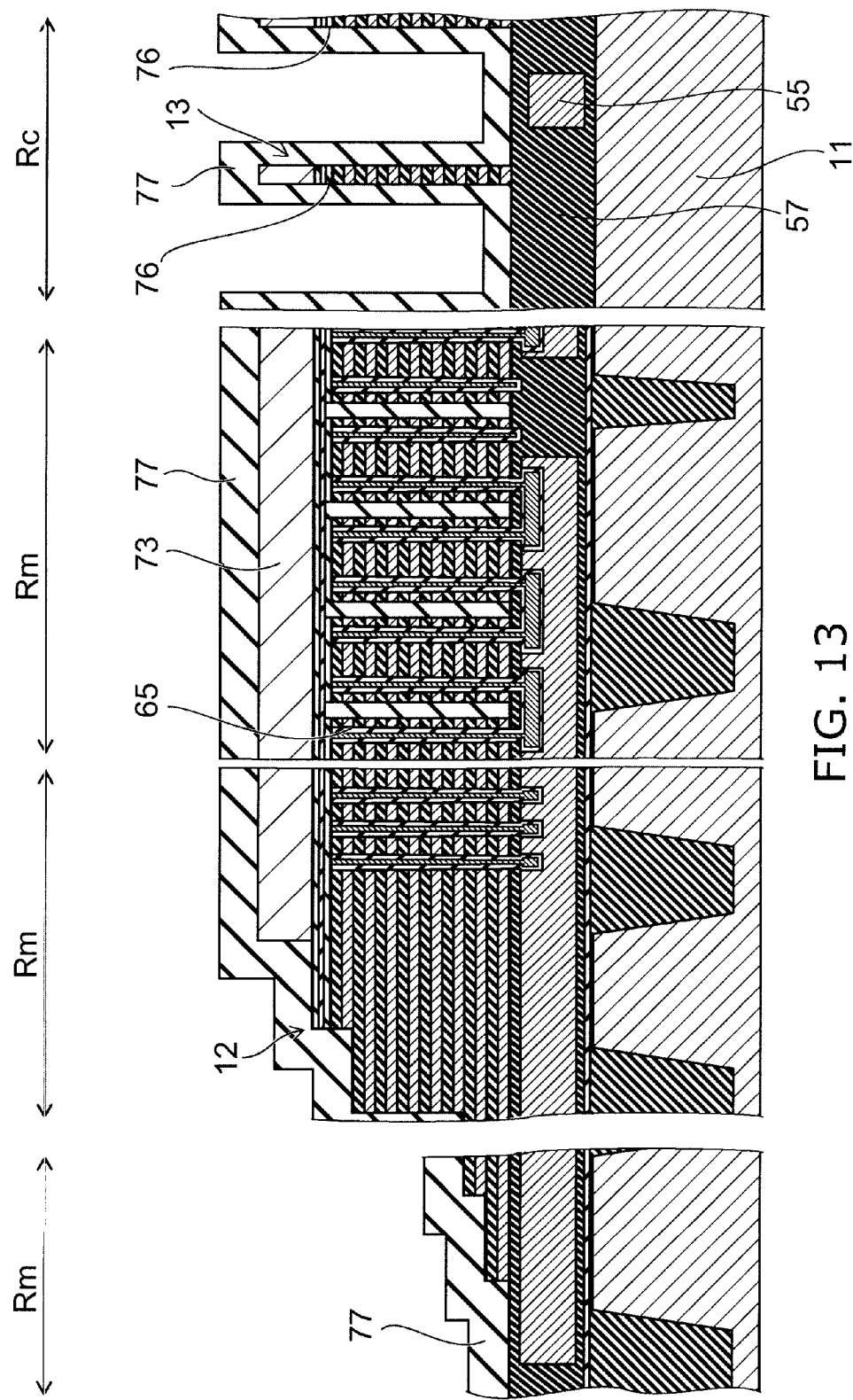

Next, as shown in FIG. 13, a resist film (not shown) is formed on the silicon film 73. Etching with this resist film used as a mask and slimming of this resist film are alternately performed to separate the multilayer body 63 into a memory multilayer body 12 and a dummy multilayer body 13. Here, the peripheral portion of the memory multilayer body 12 and the peripheral portion of the dummy multilayer body 13 are processed into a staircase pattern in which a step is formed for each polysilicon film 61. Next, dummy holes 76 are formed in the dummy multilayer body 13. The dummy hole 76 is formed so as to have a larger opening than the memory hole 65 and reach the interlayer insulating film 57 through the dummy multilayer body 13. Subsequently, a silicon nitride film 77 is entirely formed as a stopper film. The silicon nitride film 77 is formed also on the inner surface of the dummy hole 76.

Figure 14:
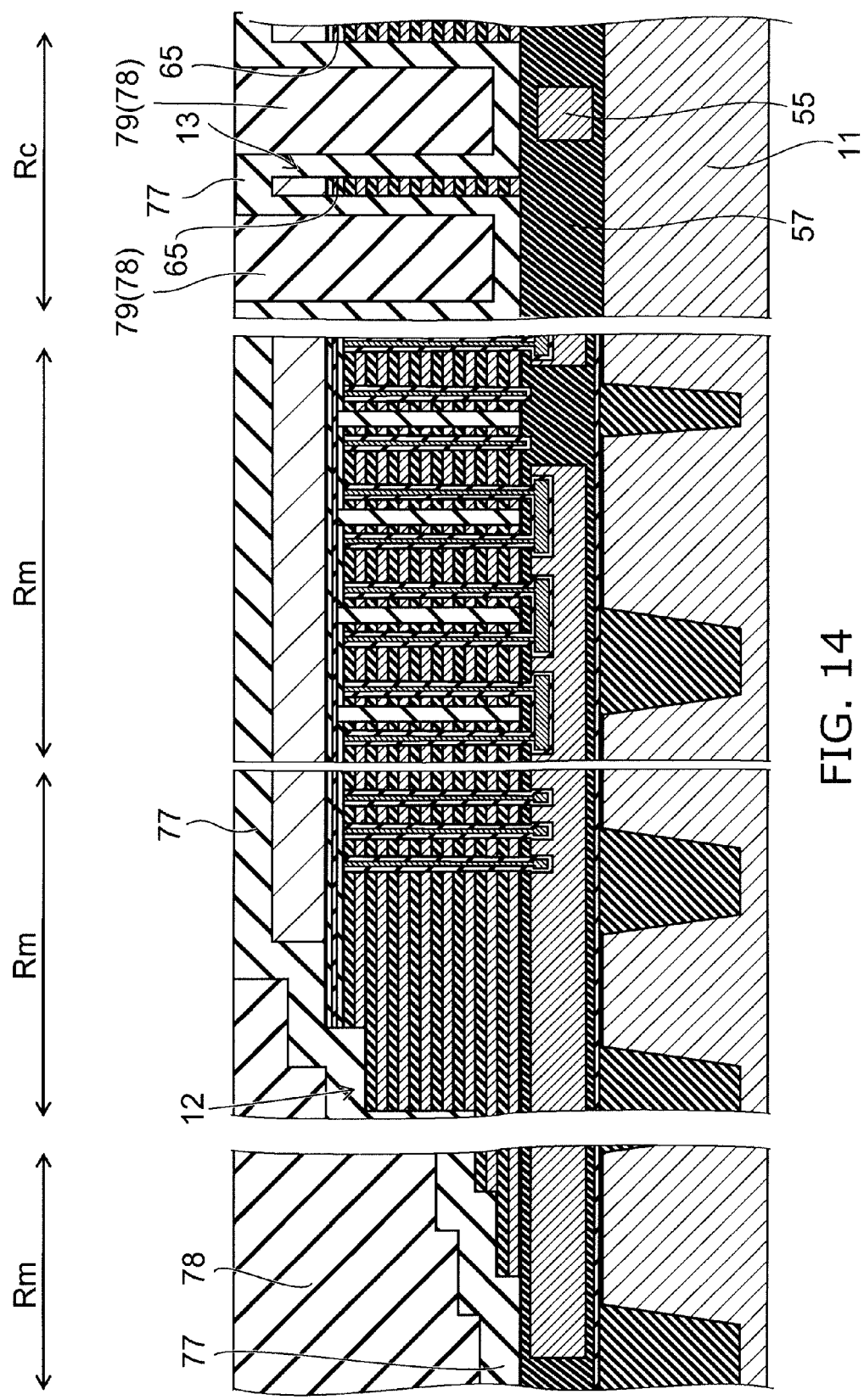

Next, as shown in FIG. 14, a silicon oxide film 78 is entirely deposited by the CVD (chemical vapor deposition) process, for instance. Next, the silicon nitride film 77 is used as a stopper to planarize the upper surface of the silicon oxide film 78 and remove it from above the memory multilayer body 12 and the dummy multilayer body 13. The silicon oxide film 78 is left between the memory multilayer body 12 and the dummy multilayer body 13 and in the dummy hole 65. The silicon oxide film 78 left in the dummy hole 65 constitutes an insulating member 79. Here, a seam may be formed in a region including the center line of the dummy hole 65 in the insulating member 79.

Figure 15:
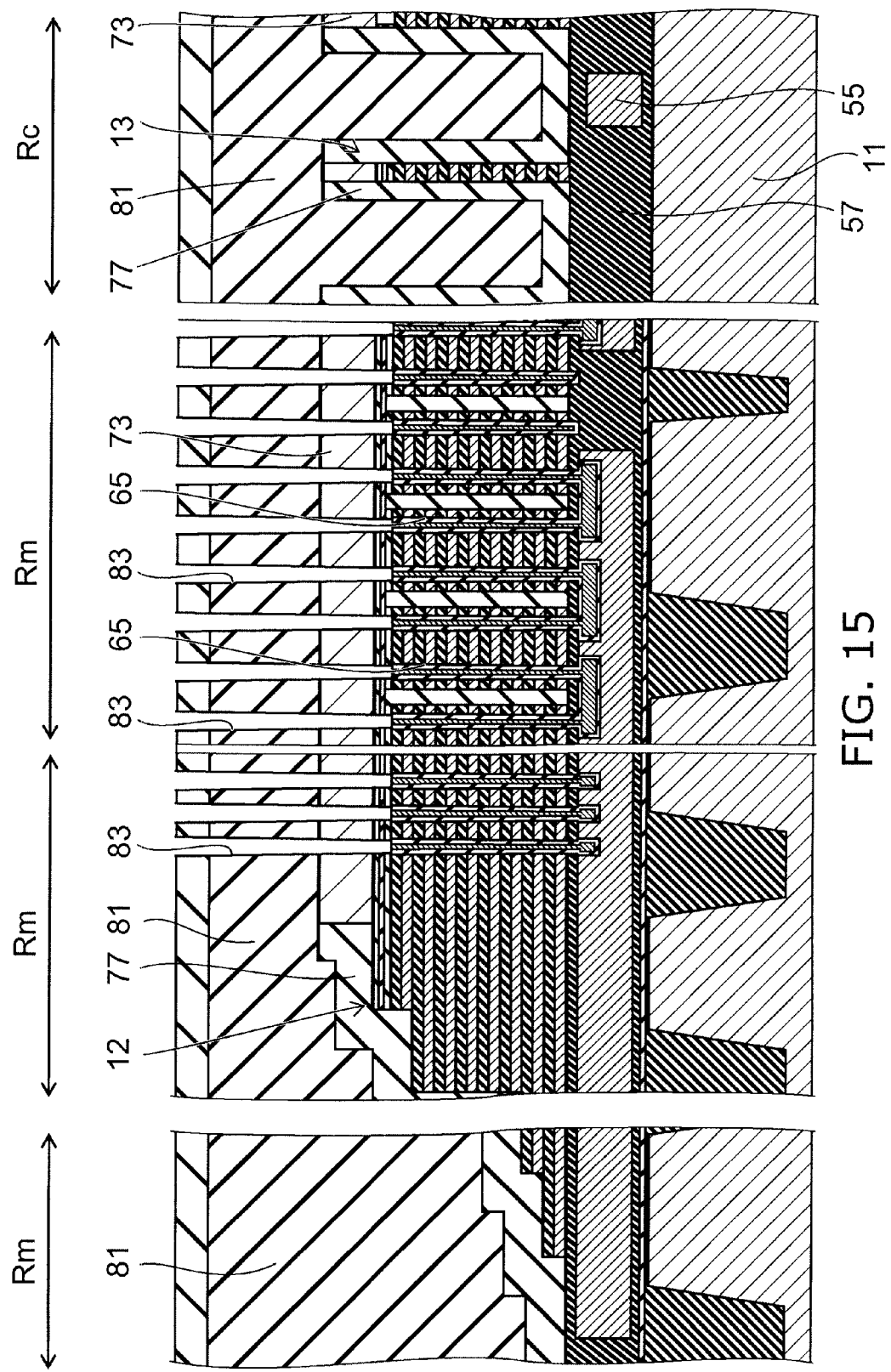

Next, as shown in FIG. 15, the silicon nitride film 77 is removed from above the memory multilayer body 12 and the dummy multilayer body 13. Next, a silicon oxide film 81 as an interlayer insulating film is deposited so as to cover the memory multilayer body 12 and the dummy multilayer body 13, and the upper surface is planarized. In the following, the silicon oxide film 78 is shown as being integrated with the silicon oxide film 81. Next, through holes 83 are formed so as to penetrate through the silicon oxide film 81 and the silicon film 73 and communicate with the memory holes 65.

Figure 16:
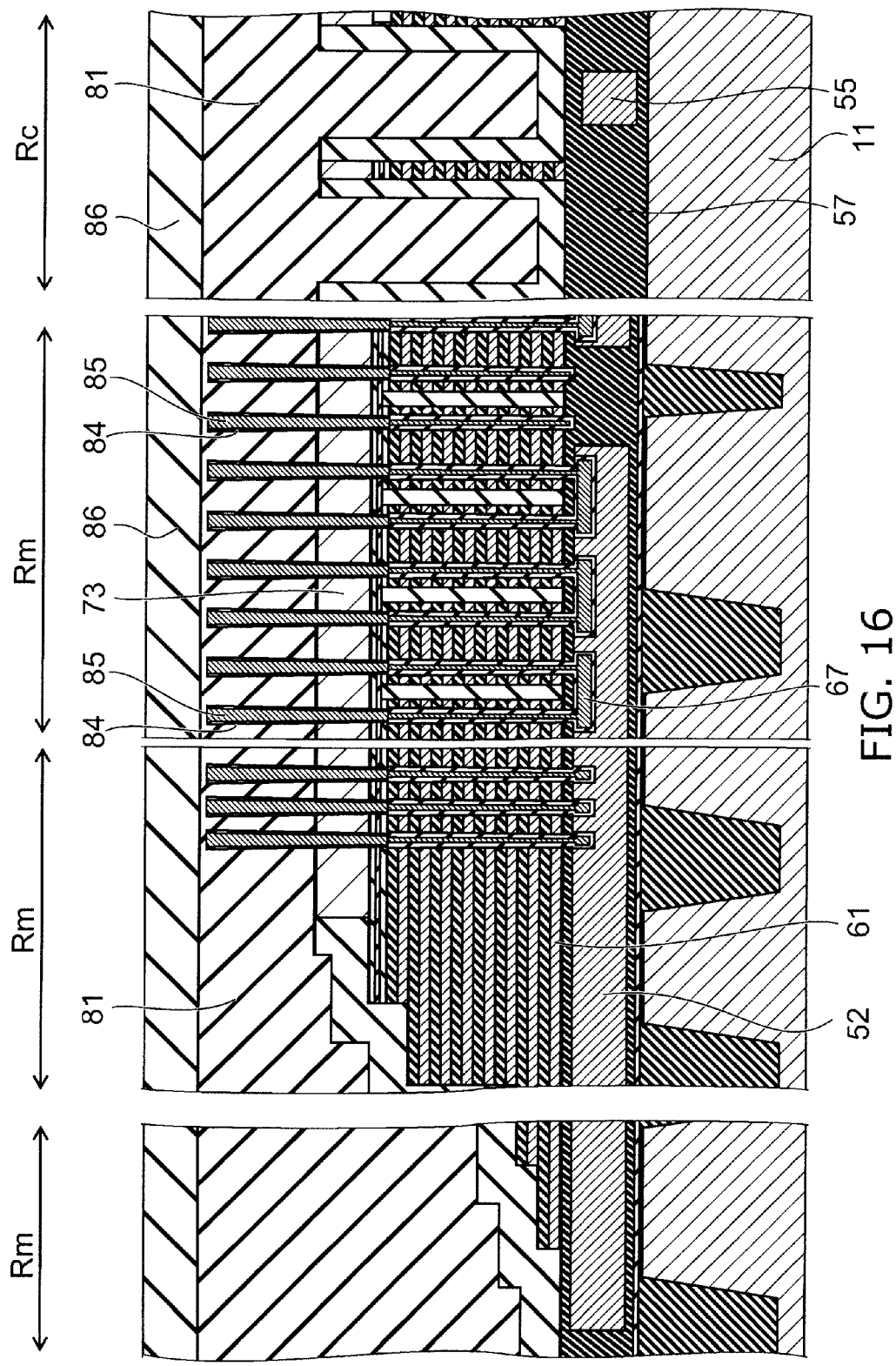

Next, as shown in FIG. 16, a gate insulating film 84 is formed on the inner surface of the through hole 83. Next, amorphous silicon is entirely deposited and etched back so that an upper pillar 85 made of amorphous silicon is buried in the through hole 83. The upper pillar 85 is connected to the U-pillar 67. Next, heat treatment at a temperature of e.g. 600° C. is performed so that the amorphous silicon constituting the amorphous silicon film 52, the amorphous silicon film 61, the U-pillar 67, the silicon film 73, and the upper pillar 85 is crystallized into polysilicon. Next, impurity, such as arsenic, is ion-implanted into the upper pillar 85 at an acceleration voltage of e.g. 40 keV and a dose amount of e.g. $3 \times 10^{15}$ cm$^{-2}$. Thus, a drain diffusion region (not shown) is formed in a portion of the upper pillar 85 located above the silicon film 73. Next, a silicon nitride film 86 is formed on the silicon oxide film 81.

Figure 17:
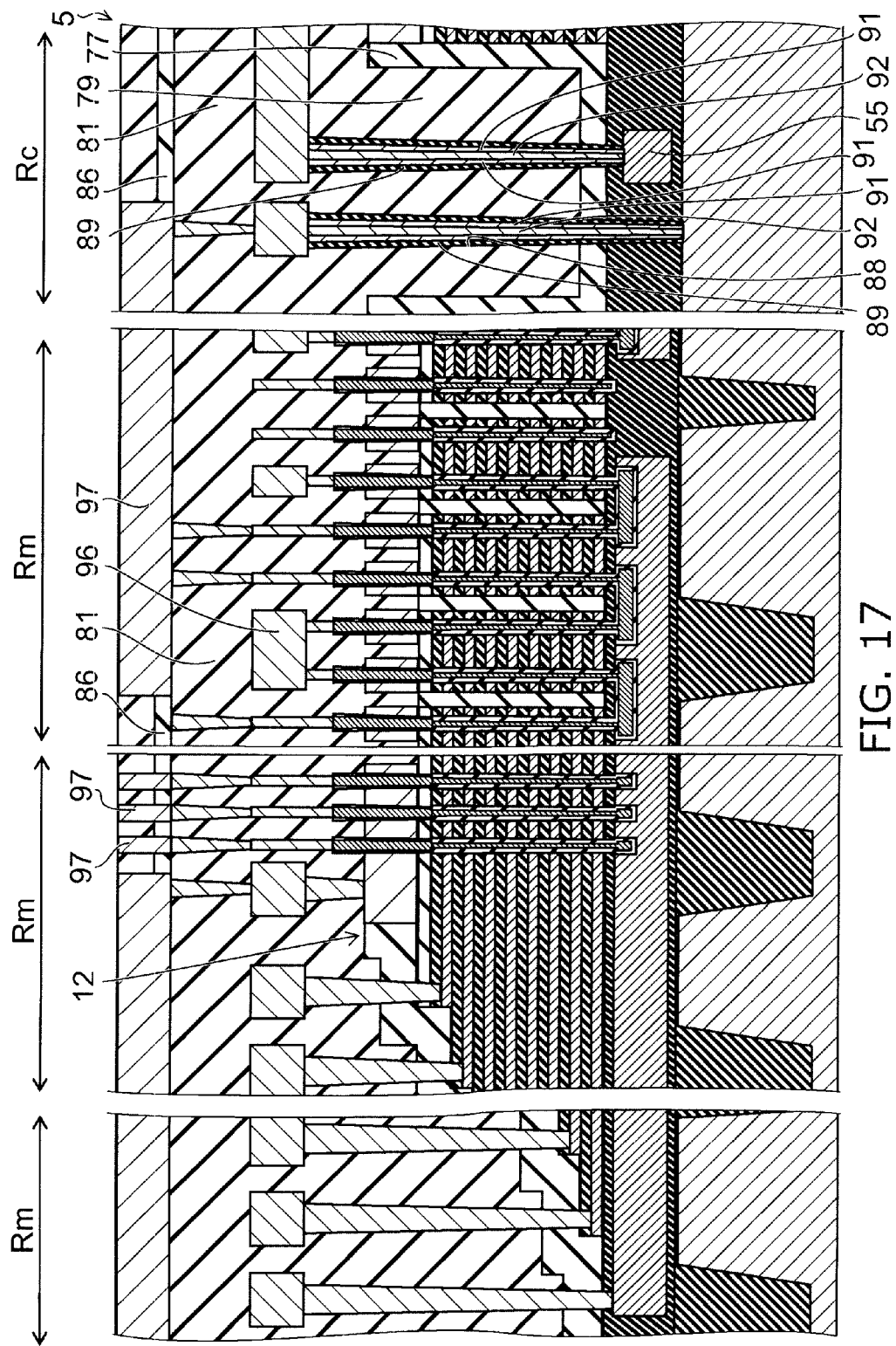

Next, as shown in FIG. 17, the silicon nitride film 86, the silicon oxide film 81, and the insulating member 79 are selectively etched to form contact holes 88. Here, the position of the contact hole 88 in the dummy hole 76 is selected as shown in the above first to fourth embodiment. A subset of the contact holes 88 are caused to reach the gate electrodes 55, and another subset of the contact holes 88 are caused to reach the source layers and drain layers (not shown) formed in the upper portion of the silicon substrate 11. Next, silicon nitride is deposited on the inner surface of the contact hole 88 to form a silicon nitride film 89 as a spacer insulating film. Next, RIE (reactive ion etching) is performed to remove the silicon nitride film 89 from the bottom surface of the contact hole 88. Thus, the silicon substrate 11 is exposed to the bottom surface of the contact hole 88.

Next, a titanium layer and a titanium nitride layer are deposited in this order to form a barrier metal 91. Here, because the silicon nitride film 89 has been formed on the side surface of the contact hole 88, the barrier metal 91 does not penetrate into a seam, if any, formed in the insulating member 79. The titanium layer constituting the barrier metal 91 reacts with the silicon substrate 11 at the bottom surface of the contact hole 88 to form titanium silicide. Next, tungsten, for instance, is buried in the contact hole 88 to form a contact 92. On the other hand, the silicon film 73 is divided into select gate electrodes. Subsequently, conventional methods are used to form source lines 96, bit lines 97, and other interconnects on the memory multilayer body 12 and the dummy multilayer body 13. Thus, a nonvolatile semiconductor memory device 5 according to this embodiment is manufactured.

Also in this embodiment, by an effect similar to that of the above first to fourth embodiment, short circuit between the contacts formed in the same dummy hole can be prevented. Furthermore, in this embodiment, the silicon nitride film 77 is deposited on the side surface of the dummy hole 76. This can further enhance insulation between the contact 92 and the electrode film of the dummy multilayer body 13, and further reduce parasitic capacitance. The effect of this embodiment other than the foregoing is the same as that of the above first embodiment.

The invention has been described with reference to the embodiments. However, the invention is not limited to these embodiments. For instance, the above embodiments can be practiced in combination with each other. Furthermore, those skilled in the art can suitably modify the above embodiments by addition, deletion, or design change of components, or by addition, omission, or condition change of processes, and such modifications are also encompassed within the scope of the invention as long as they fall within the spirit of the invention. For instance, the end portion of the dummy multilayer body 13 may be steep in the stacking direction instead of being processed into a staircase pattern.

The invention claimed is:

1. A nonvolatile semiconductor memory device comprising:
    a substrate;
    a memory multilayer body with a plurality of insulating films and electrode films alternately stacked therein, the memory multilayer body being provided on a memory array region of the substrate;
    a semiconductor pillar buried in the memory multilayer body and extending in stacking direction of the insulating films and the electrode films;
    a charge storage film provided between one of the electrode films and the semiconductor pillar;
    a dummy multilayer body with a plurality of the insulating films and the electrode films alternately stacked therein and a dummy hole formed therein, the dummy multilayer body being provided on a peripheral circuit region of the substrate;
    an insulating member buried in the dummy hole; and
    a plurality of contacts buried in the insulating member and extending in the stacking direction so that each of the plurality of contacts buried in the insulating member are buried in the dummy hole,
    wherein an equal potential is applied to the plurality of the contacts.

2. The nonvolatile semiconductor memory device according to claim 1, wherein
    the substrate is made of a semiconductor material,
    a field-effect transistor is formed in the peripheral circuit region, and
    the plurality of the contacts are connected to a source layer of the field-effect transistor.

3. The nonvolatile semiconductor memory device according to claim 1, wherein
    the substrate is made of a semiconductor material,
    a field-effect transistor is formed in the peripheral circuit region, and
    the plurality of the contacts are connected to a drain layer of the field-effect transistor.

4. The nonvolatile semiconductor memory device according to claim 1, wherein
    the substrate is made of a semiconductor material,
    a field-effect transistor is formed in the peripheral circuit region, and
    the plurality of the contacts are connected to a gate electrode of the field-effect transistor.

5. A nonvolatile semiconductor memory device, comprising:
    a substrate;
    a memory multilayer body with a plurality of insulating films and electrode films alternately stacked therein, the memory multilayer body being provided on a memory array region of the substrate;
    a semiconductor pillar buried in the memory multilayer body and extending in stacking direction of the insulating films and the electrode films;
    a charge storage film provided between one of the electrode films and the semiconductor pillar;
    a dummy multilayer body with a plurality of the insulating films and the electrode films alternately stacked therein and a dummy hole formed therein, the dummy multilayer body being provided on a peripheral circuit region of the substrate;
    an insulating member buried in the dummy hole; and
    a plurality of contacts buried in the insulating member and extending in the stacking direction so that each of the plurality of contacts buried in the insulating member are buried in the dummy hole,
    wherein as viewed in the stacking direction, the plurality of the contacts are placed at positions displaced from a center line extending longitudinally along the dummy hole.

6. The nonvolatile semiconductor memory device according to claim 5, wherein
    the substrate is made of a semiconductor material,
    a field-effect transistor is formed in the peripheral circuit region, and
    one of the plurality of the contacts is connected to a source layer or a drain layer of the field-effect transistor, and another of the plurality of the contacts is connected to a gate electrode of the field-effect transistor.

7. The nonvolatile semiconductor memory device according to claim 5, wherein
    the substrate is made of a semiconductor material,
    a plurality of field-effect transistors are formed in the peripheral circuit region, and
    the plurality of the contacts are connected to respective gate electrodes of the plurality of field-effect transistors.

8. The nonvolatile semiconductor memory device according to claim 1, further comprising:
    a spacer insulating film formed on a side surface of a contact hole having the contact buried therein.

9. The nonvolatile semiconductor memory device according to claim 8, wherein the insulating member is made of silicon oxide, and the spacer insulating film is made of silicon nitride.

10. The nonvolatile semiconductor memory device according to claim 8, wherein
the substrate is made of a semiconductor material,
a field-effect transistor is formed in the peripheral circuit region, and
of the plurality of the contacts, one is connected to a source layer or a drain layer of the field-effect transistor, and another is connected to a gate electrode of the field-effect transistor.

11. The nonvolatile semiconductor memory device according to claim 8, wherein
the substrate is made of a semiconductor material,
a plurality of field-effect transistors are formed in the peripheral circuit region, and
the plurality of the contacts are connected to respective gate electrodes of the plurality of field-effect transistors.

12. The nonvolatile semiconductor memory device according to claim 1, wherein
as viewed in the stacking direction, the plurality of the contacts are placed at positions displaced from a center line extending longitudinally along the dummy hole, and
an equal potential is applied to the plurality of the contacts.

13. The nonvolatile semiconductor memory device according to claim 1, further comprising:
a spacer insulating film formed on a side surface of a contact hole having the contact buried therein,
an equal potential being applied to the plurality of the contacts.

14. The nonvolatile semiconductor memory device according to claim 1, further comprising:
a spacer insulating film formed on a side surface of a contact hole having the contact buried therein,
as viewed in the stacking direction, the plurality of the contacts being placed at positions displaced from a center line extending longitudinally along the dummy hole.

15. The nonvolatile semiconductor memory device according to claim 1, further comprising:
a spacer insulating film formed on a side surface of a contact hole having the contact buried therein,
as viewed in the stacking direction, the plurality of the contacts being placed at positions displaced from a center line extending longitudinally along the dummy hole, and
an equal potential being applied to the plurality of the contacts.

16. The nonvolatile semiconductor memory device according to claim 1, wherein number of the electrode films stacked in the dummy multilayer body is equal to the number of the electrode films stacked in the memory multilayer body.

17. The nonvolatile semiconductor memory device according to claim 1, wherein upon the upper surface of the substrate being partitioned into a plurality of unit regions, the memory multilayer body and the dummy multilayer body are provided in each of the unit regions at an area ratio of 50% or more in total.

18. The nonvolatile semiconductor memory device according to claim 17, wherein the each of the unit regions is a square region measuring 10 microns on a side.

* * * * *